(12) United States Patent
Hagio et al.

(10) Patent No.: US 8,859,167 B2
(45) Date of Patent: Oct. 14, 2014

(54) PATTERN FORMING METHOD, POSITIONAL DEVIATION MEASURING METHOD AND PHOTOMASK

(71) Applicants: Yoshinori Hagio, Mie (JP); Yosuke Okamoto, Mie (JP)

(72) Inventors: Yoshinori Hagio, Mie (JP); Yosuke Okamoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/724,498

(22) Filed: Dec. 21, 2012

(65) Prior Publication Data

US 2014/0065522 A1  Mar. 6, 2014

(30) Foreign Application Priority Data

Aug. 31, 2012 (JP) ................................. 2012-191940

(51) Int. Cl.
*G03F 1/00* (2012.01)
*G03F 7/20* (2006.01)

(52) U.S. Cl.
CPC .............. *G03F 7/70633* (2013.01); *G03F 1/00* (2013.01); *G03F 7/70533* (2013.01)
USPC ............................................... 430/5; 430/22

(58) Field of Classification Search
USPC ....................................................... 430/5, 22
See application file for complete search history.

(56) References Cited

U.S. PATENT DOCUMENTS 5,712,707 A * 1/1998 Ausschnitt et al. ........... 356/401

FOREIGN PATENT DOCUMENTS

| JP | 8-191045 | 7/1996 |
| JP | 11-52545 | 2/1999 |
| JP | 2007-324371 | 12/2007 |

* cited by examiner

*Primary Examiner* — Christopher Young
(74) *Attorney, Agent, or Firm* — Oblon, Spivak, McClelland, Maier & Neustadt, L.L.P.

(57) ABSTRACT

According to one embodiment, a positional deviation measuring method includes measuring a positional deviation of a device pattern formed in a lower layer portion using an alignment mark of the lower layer portion as a reference; measuring a positional deviation of a device pattern formed in an upper layer portion above the lower layer portion using an alignment mark of the upper layer portion as a reference; measuring a positional deviation between the alignment mark of the lower layer portion and the alignment mark of the upper layer portion; and calculating a positional deviation between the device patterns based on the positional deviation between the alignment marks.

5 Claims, 6 Drawing Sheets

PATTERN FORMING METHOD, POSITIONAL DEVIATION MEASURING METHOD AND PHOTOMASK

CROSS-REFERENCE TO RELATED APPLICATIONS

This application is based upon and claims the benefit of priority from Japanese Patent Application No. 2012-191940, filed on Aug. 31, 2012; the entire contents of which are incorporated herein by reference.

FIELD

The present invention relates to a pattern forming method, a positional deviation measuring method and a photomask.

BACKGROUND

In a process of manufacturing a semiconductor device, matching a positional relation between patterns formed through different processes at high precision has a very great impact on the operative properties of a device. Therefore, a technology to measure the positional relation at high precision is important in a process of manufacturing a semiconductor device, and miniaturization of a device is made progress in these days, required precision continuously becomes strict.

In general, in a match measuring technology used when manufacturing a semiconductor device, an alignment mark belonging to a lower layer is adjacent to an alignment mark belonging to an upper layer and their relative positional relation is measured. Since there is a need to penetrate the upper layer so as to measure the alignment mark of the lower layer, an optical microscope is used for measuring.

Therefore, the alignment mark is formed in a pattern of which one side is 100 nm or larger and which can be observed at a corresponding wavelength band, or smaller patterns are densely enumerated, thus an alignment mark of a size recognizable with the optical microscope is formed.

On the other hand, due to progress in miniaturization of a lithography technology, a pattern of a state-of-the art device is formed in a pattern which is 100 nm or smaller in minimum dimension. For this reason, a situation that deviates between dimensions of a pattern involved in an operation of a device and an alignment mark configured to measure the positional relation of the upper and lower layers of the device pattern occurs.

In a lithography process, since a dimension of a pattern on a photomask is smaller than a wavelength of a light source radiated from an exposure unit to a photomask, a light radiated to a pattern diffracts and forms an image on a wafer through an optical system of the exposure unit. However, the smaller the dimension of the pattern is, the larger the angle of diffraction becomes, in principle. Therefore, as a result that lights radiated to and diffracted from respective patterns of different dimensions diffract at different angles of diffraction, the lights pass through different parts of a lens, thus the patterns image-formed on the wafer have different impacts due to a local distortion of a lens.

From the description above, it is expected that an image formation state of light penetrating a lens can be different between an alignment mark and a device pattern and such a trend will become conspicuous in the future as a miniaturization of a device pattern progresses.

DETAILED DESCRIPTION

In general, according to one embodiment, a positional deviation measuring method includes measuring a positional deviation of a device pattern formed in a lower layer portion using an alignment mark of the lower layer portion as a reference; measuring a positional deviation of a device pattern formed in an upper layer portion above the lower layer portion using an alignment mark of the upper layer portion as a reference; measuring a positional deviation between the alignment mark of the lower layer portion and the alignment mark of the upper layer portion; and calculating a positional deviation between the device patterns based on the positional deviation between the alignment marks.

With reference to the accompanying drawings below, a positional deviation measuring method according to embodiments will be described in detail. The present invention is not limited to these embodiments.

First Embodiment

Figures 1A, 1B, 1C:
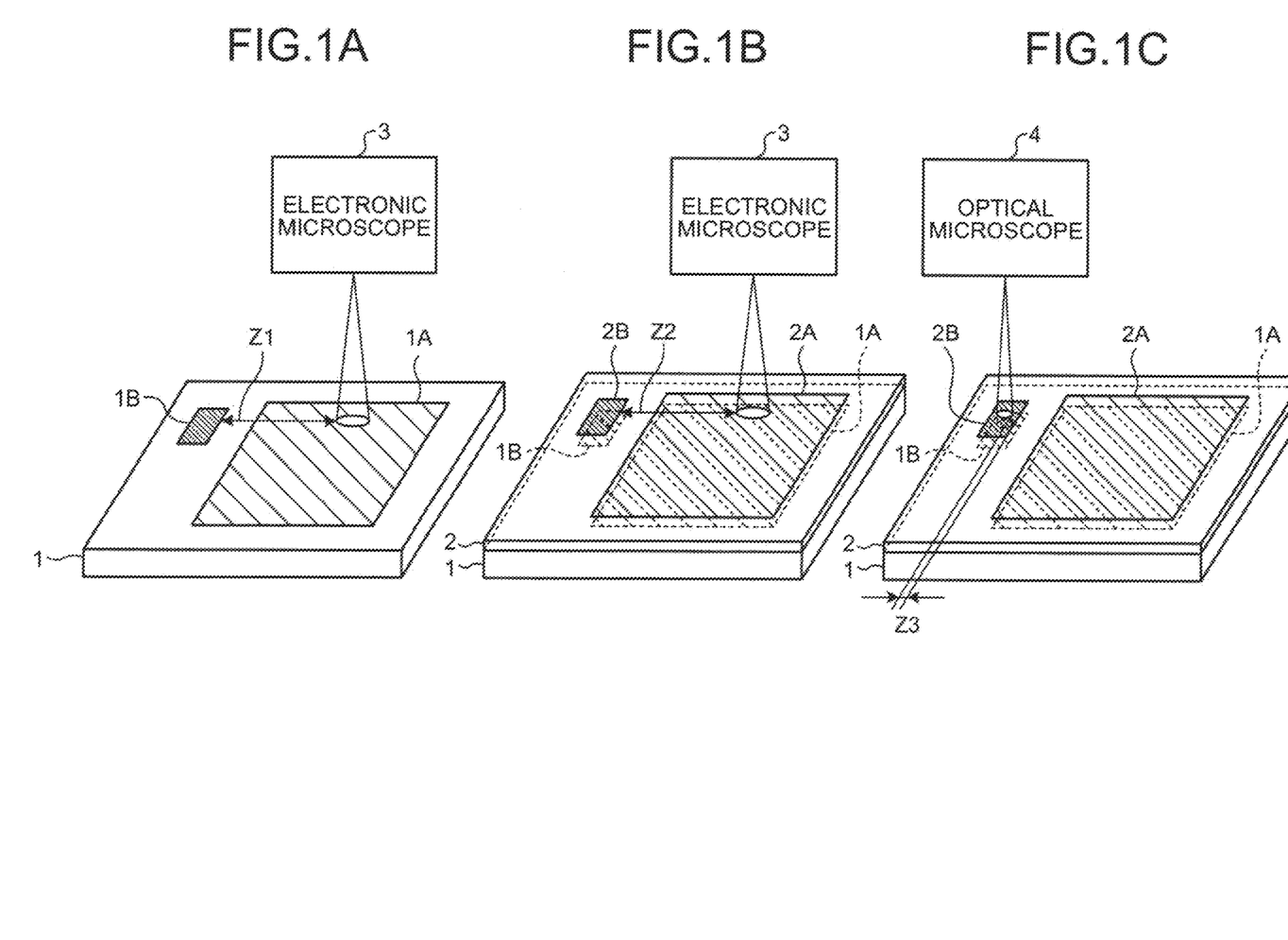
FIGS. 1A to 1C are perspective views illustrating a positional deviation measuring method according to a first embodiment.

FIGS. 1A to 1C are perspective views illustrating a positional deviation measuring method according to a first embodiment.

In FIG. 1A, a device pattern 1A and an alignment mark 1B are formed in a lower layer portion 1. A scanning electronic microscope 3 observes the device pattern 1A and the alignment mark 1B to compare their image data with, for example, design data to calculate a positional deviation Z1 of the device pattern 1A using the alignment mark 1B as a reference. The scanning electronic microscope 3 can have a length measuring function. The positional deviation Z1 of the device pattern 1A may be a positional deviation Z1 of a resist pattern corresponding to the device pattern 1A or a positional deviation Z1 of a processed pattern which is processed using the resist pattern corresponding to the device pattern 1A as a mask.

As illustrated in FIG. 1B, a device pattern 2A and an alignment mark 2B are formed in an upper layer portion 2 above the lower layer portion 1. The scanning electronic microscope 3 observes the device pattern 2A and the alignment mark 2B to compare their image data with, for example, design data to calculate a positional deviation Z2 of the device pattern 2A using the alignment mark 2B as a reference. The positional deviation Z2 of the device pattern 2A may be a positional deviation Z2 of a resist pattern corresponding to the device pattern 2A or a positional deviation Z2 of a processed pattern which is processed using the resist pattern corresponding to the device pattern 2A as a mask.

The lower layer portion 1 and the upper layer portion 2 may be, for example, a semiconductor substrate, a semiconductor layer, a conductor layer, or an insulating layer. The device patterns 1A and 2A may be, for example, a gate electrode, wiring, or a contact hole. The alignment marks 1B and 2B can be arranged on a scribe line of a semiconductor wafer.

As illustrated in FIG. 1C, an optical microscope 4 measures a positional deviation Z3 between the alignment marks 1B and 2B. At this time, the optical microscope 4 can observe the alignment mark 1B of the lower layer portion 1 through the upper layer portion 2. A positional deviation between the device patterns 1A and 2A is calculated based on a positional deviation Z3 between the alignment marks 1B and 2B. Since a positional deviation of the device pattern 1A using the alignment mark 1B as a reference is Z1, a positional deviation of the device pattern 2A using the alignment mark 2B as a reference is Z2, and a positional deviation between the alignment marks 1B and 2B is Z3, a positional deviation between the device patterns 1A and 2A can be Z3−(Z1+Z2).

To obtain a positional deviation between the device patterns 1A and 2A, reference to the positional deviations Z1 and Z2 measured with the scanning electronic microscope 3 is made for the positional deviation Z3 between the alignment marks 1B and 2B, thus even when the device patterns 1A and 2A are formed in minimal patterns which may not be observed by the optical microscope 4, it is possible to consider local distortion or the like of the device patterns 1A and 2A and improve measuring precision of a positional deviation between the device patterns 1A and 2A. As a measuring method of a positional deviation of an alignment mark and a device pattern, an image acquired by the scanning electronic microscope is contrasted with design data of a corresponding pattern, thus a technique can be used in which a positional relation that the alignment mark and the device pattern essentially have is compared with a positional relation of the alignment mark and the device pattern that are measured from a real image to measure a positional relation of the alignment mark and the device pattern.

Figure 2:
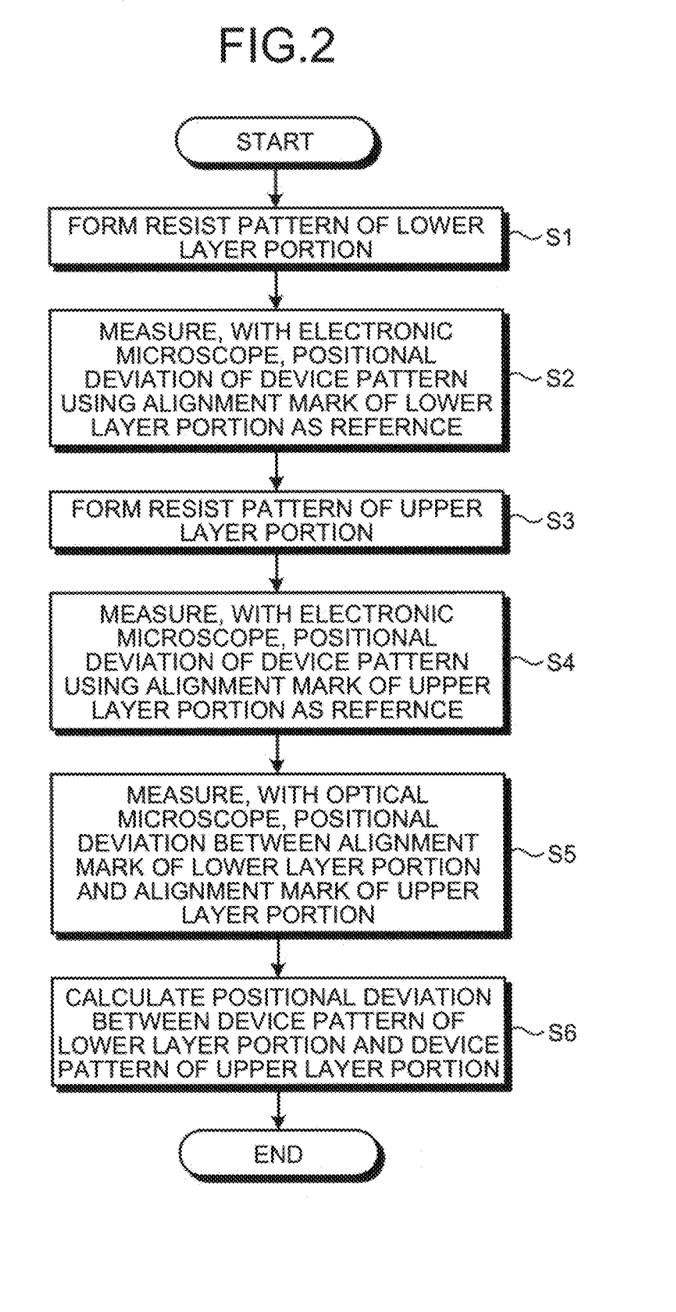
FIG. 2 is a flowchart illustrating a positional deviation measuring method according to the first embodiment.

FIG. 2 is a flowchart illustrating a positional deviation measuring method according to the first embodiment.

In FIG. 2, in step S1, a resist pattern is formed in the lower layer portion 1. In step S2, the scanning electronic microscope 3 measures the positional deviation Z1 of the device pattern 1A using the alignment mark 1B as a reference. The resist pattern may be measured, and a processed pattern which is processed using the resist pattern as a mask may be measured.

In step S3, a resist pattern is formed in the upper layer portion 2. In step S4, the scanning electronic microscope 3 measures the positional deviation Z2 of the device pattern 2A using the alignment mark 2B as a reference.

Subsequently, in step S5, the optical microscope 4 measures the positional deviation Z3 between the alignment marks 1B and 2B. In step S6, a positional deviation between the device patterns 1A and 2A is calculated based on the positional deviation Z3 between the alignment marks 1B and 2B and the positional deviations Z1 and Z2 of the device patterns 1A and 2A. Any of measuring the positional deviation Z2 with the scanning electronic microscope 3 and measuring the positional deviation Z3 with the optical microscope 4 may be first carried out.

Subsequently, it is determined whether the calculated positional deviation between the device patterns 1A and 2A is within an acceptable range as a device. When it is determined that the positional deviation is within the acceptable range, a workpiece of the upper layer portion 2 is processed using the resist pattern of the upper layer portion 2 as a mask to form a processed pattern. On the other hand, when the positional deviation between the device patterns 1A and 2A is not within the acceptable range, the resist pattern of the upper layer portion 2 is peeled by etching or the like and then a resist pattern is re-formed. Subsequently, previous steps including step S6 of calculating the positional deviation between the device patterns 1A and 2A are repeated until it is determined that the positional deviation between the device patterns 1A and 2A falls in the acceptable range.

Second Embodiment

Figure 3A:
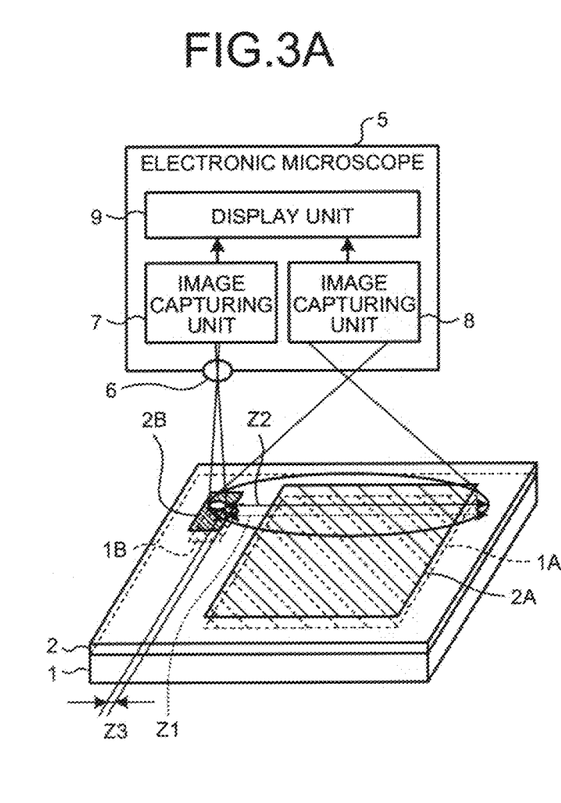
FIG. 3A is a perspective view illustrating a positional deviation measuring method according to a second embodiment.
Figure 3B:
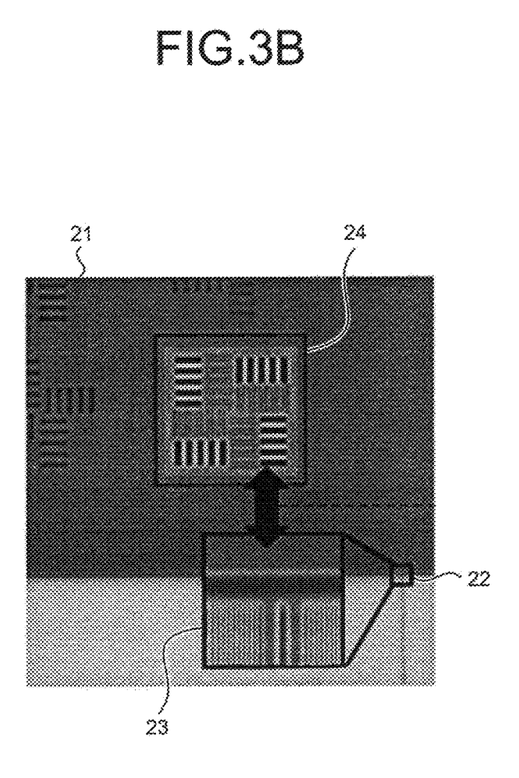
FIG. 3B is a diagram illustrating an example of a display screen 21 of a display unit 9 of FIG. 3A.

FIG. 3A is a perspective view illustrating a positional deviation measuring method according to a second embodiment, and FIG. 3B is a diagram illustrating an example of a display screen 21 of a display unit 9 of FIG. 3A.

In FIGS. 3A and 3B, an optical lens 6 is mounted on a scanning electronic microscope 5. It is possible to set the maximum of the view field of the scanning electronic microscope 5 to be 100 μm or larger. The scanning electronic microscope 5 includes an image capturing unit 7 that captures an optical image observed through the optical lens 6, an image capturing unit 8 that captures a scan electron image of the scanning electronic microscope 5, and a display unit 9 that displays images captured by the image capturing units 7 and 8.

Before the upper layer portion 2 is formed above the lower layer portion 1, the scanning electronic microscope 5 measures the positional deviation Z1 of the device pattern 1A using the alignment mark 1B as a reference. After the upper layer portion 2 is formed above the lower layer portion 1, the scanning electronic microscope 5 measures the positional deviation Z2 of the device pattern 2A using the alignment mark 2B as a reference. Optical images of the alignment marks 1B and 2B are captured by the image capturing unit 7 through the optical lens 6, thus the positional deviation Z3 between the alignment marks 1B and 2B is measured.

On the display screen 21 of the display unit 9, the optical image 22 of the device pattern 2A and the optical image 24 of the alignment marks 1B and 2B are displayed and a scan electron image 23 which is an enlarged image of the optical image 22 of the device pattern 2A is simultaneously displayed.

Since the optical lens 6 is mounted on the scanning electronic microscope 5, it is possible to simultaneously observe the optical image 24 of the alignment marks 1B and 2B and the scan electron image 23 of the device pattern 2A on the display screen 21.

Since the maximum of a view field of the scanning electronic microscope 5 is set to be 100 μm or larger, it is possible to simultaneously observe the alignment mark 1B and the device pattern 1A in the same view field and simultaneously observe the alignment mark 2B and the device pattern 2A in the same view field. For this reason, in order to measure the positional deviations Z1 and Z2 of the device patterns 1A and 2A using each alignment mark 1B and 2B as a reference, there is no need to move a wafer stage and it is possible to prevent measuring precision from degrading due to the movement error of the wafer stage. It is possible to compare a measurement value and a design value representing a positional relation between the alignment marks 1B and 2B and the device patterns 1A and 2A and obtain deviations from positions where they are to be essentially arranged.

Third Embodiment

Figure 4A:
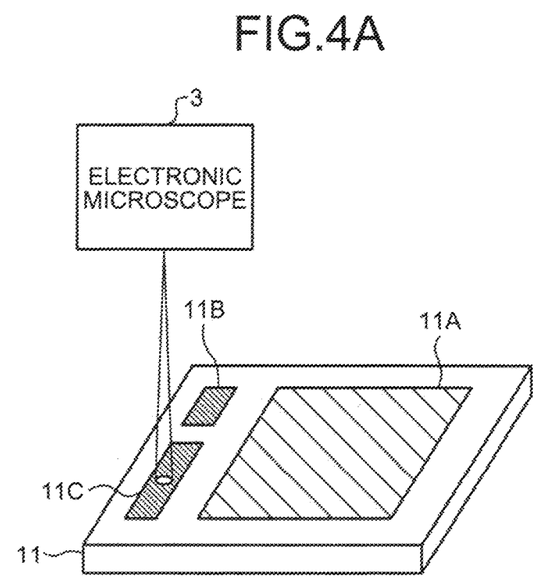
FIGS. 4A and 4B are a perspective views illustrating a measuring-instrument difference correcting method in positional deviation measuring according to a third embodiment.
Figure 4B:
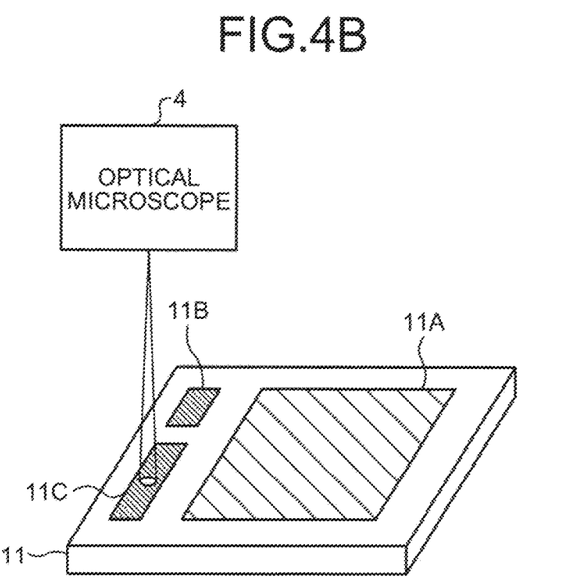

FIGS. 4A and 4B are perspective views illustrating a measuring-instrument difference correcting method between different measuring devices in positional deviation measuring according to a third embodiment.

In FIG. 4A, a layer 11 is provided with a device pattern 11A, an alignment mark 11B, and a measuring-instrument difference correcting pattern 11C. The layer 11 may be the lower layer portion 1 or the upper layer portion 2 of FIGS. 1A to 1C. The alignment mark 11B and the measuring-instrument difference correcting pattern 11C can be arranged on, for example, the scribe line of a semiconductor wafer. A plurality of pairs of patterns with certain positional deviation amounts is provided to the measuring-instrument difference correcting pattern 11C so that the positional deviation amounts are different. The scanning electronic microscope 3 measures a positional deviation amount of the measuring-instrument difference correcting pattern 11C and obtains the positional deviation amount of the pattern 11C according to the scanning electronic microscope 3.

Then, as illustrated in FIG. 4B, the optical microscope 4 measures a positional deviation amount of the measuring-instrument difference correcting pattern 11C and obtains the positional deviation amount of the pattern 11C according to the optical microscope 4. Measurement value of one or both of the scanning electronic microscope and the optical microscope is corrected to match the measuring result of the positional deviation amount of the pattern 11C between the scanning electronic microscope 3 and the optical microscope 4.

Figure 5:
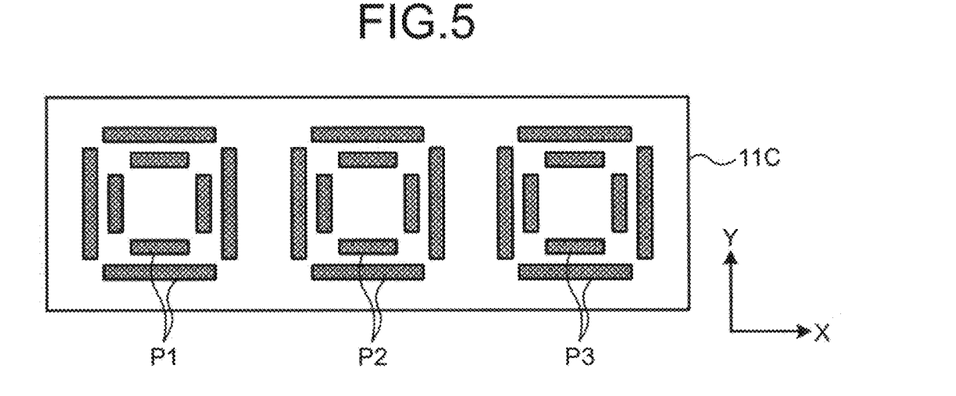
FIG. 5 is a plan view illustrating an example of a measuring-instrument difference correcting pattern of FIG. 4.

FIG. 5 is a plan view illustrating an example of a measuring-instrument difference correcting pattern of FIGS. 4A and 4B.

In FIG. 5, the measuring-instrument difference correcting pattern 11C is provided with a first pattern P1, a second pattern P2, and a third pattern P3. Respective inner patterns and outer patterns are provided to the first pattern P1, the second pattern P2, and the third pattern P3. The outer patterns are arranged to surround the inner patterns.

The second pattern P2 is arranged so that its weighted center matches between the inner patterns and the outer patterns. It is possible to configure the second pattern P2 so that the pattern has 180° rotational symmetry with respect to the weighted center. The first pattern P1 and the third pattern P3 are arranged so that weighted centers do not match between the inner patterns and the outer patterns. The first pattern P1 and the third pattern P3 can be configured so that a weighted center is deviated between the inner patterns and the outer patterns in opposite directions. For example, for the first pattern P1, the weighted center of the inner patterns can be deviated by −2 nm in X direction and 2 nm in Y direction with respect to the weighted center of the outer patterns. For the third pattern P3, the weighted center of the inner patterns can be deviated by 2 nm in X direction and −2 nm in Y direction with respect to the weighted center of the outer patterns. The first pattern P1, the second pattern P2, and the third pattern P3 are adjacent to each other but can be individually arranged within a square area of which one side is 104 μm or smaller.

Figure 6:
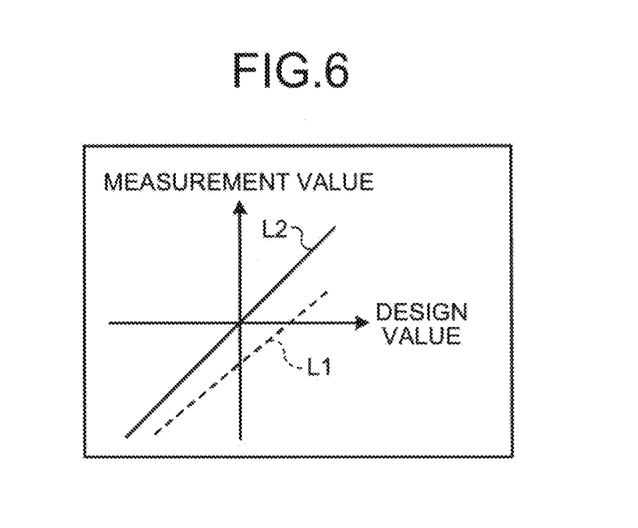
FIG. 6 is a diagram illustrating a relation between a measurement value and a design value of an offset in the measuring-instrument difference correcting pattern of FIG. 5.

FIG. 6 is a diagram illustrating a relation between a measurement value and a design value of a positional deviation amount in the measuring-instrument difference correcting pattern of FIG. 5.

In FIG. 6, the first pattern P1, the second pattern P2, and the third pattern P3 of FIG. 5 are formed in the layer 11 of FIGS. 4A and 4B. The scanning electronic microscope 3 measures positional deviation amounts of the first pattern P1, the second pattern P2, and the third pattern P3 to obtain a relation L1 between a measurement value and a design value of each positional deviation amount of P1, P2, and P3 according to the scanning electronic microscope 3 as an approximate straight line. The optical microscope 4 measures positional deviation amounts of the first pattern P1, the second pattern P2, and the third pattern P3 to obtain a relation L2 between a measurement value and a design value of each positional deviation amount of P1, P2, and P3 according to the optical microscope 4 as an approximate straight line. Measuring sensitivity of one or both of the scanning electronic microscope 3 and the optical microscope 4 is corrected so that approximate straight lines between the scanning electronic microscope 3 and the optical microscope 4 match. When two approximate straight lines representing these relations L1 and L2 have offsets or their slopes are different, it is possible to apply and correct these relations L1 and L2 to the measuring result of the scanning electronic microscope 3 to match the measuring result of the optical microscope 4.

Figure 7:
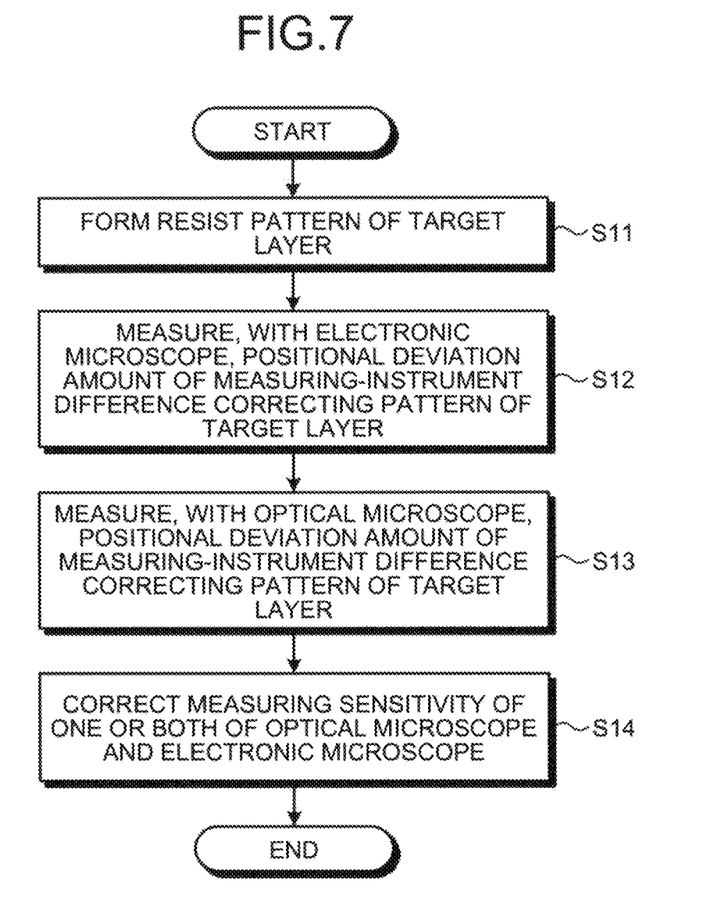
FIG. 7 is a flowchart illustrating a measuring-instrument difference correcting method in positional deviation measuring according to a third embodiment.

FIG. 7 is a flowchart illustrating a measuring-instrument difference correcting method in a positional deviation measuring according to a third embodiment.

In FIG. 7, in step S11, a resist pattern is formed in the layer 11. In step S12, the scanning electronic microscope 3 measures positional deviation amounts of the first pattern P1, the second pattern P2, and the third pattern P3. In this case, the resist pattern may be measured and a processed pattern which is processed using the resist pattern as a mask may be measured.

Subsequently, in step S13, the optical microscope 4 measures positional deviation amounts of the first pattern P1, the second pattern P2, and the third pattern P3. In this case, the resist pattern may be measured and a processed pattern which is processed using the resist pattern as a mask may be measured. In step S14, measuring sensitivity of one or both of the scanning electronic microscope 3 and the optical microscope 4 is corrected so that measurement values between the scanning electronic microscope 3 and the optical microscope 4 match.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photomask comprising:
    a pair of first patterns, and
    a pair of second patterns that have a positional deviation amount of weighted centers different from that of the first patterns.

2. The photomask according to claim 1, wherein the first patterns are adjacent to the second patterns.

3. The photomask according to claim 1,
    wherein the first patterns include:
    first inner patterns, and
    first outer patterns that are arranged outside the first inner patterns, and
    wherein the second patterns include:
    second inner patterns, and second outer patterns that are arranged outside the second inner patterns.

4. The photomask according to claim 1, wherein when the positional deviation amount of the first patterns or the second patterns is 0, the first patterns or the second patterns have a 180° rotational symmetry.

5. The photomask according to claim 1, wherein the first patterns and the second patterns are individually arranged in a square area.

\* \* \* \* \*